United States Patent [19]

Kai et al.

[11] Patent Number: 5,329,130
[45] Date of Patent: Jul. 12, 1994

[54] CHARGED PARTICLE BEAM EXPOSURE METHOD AND APPARATUS

[75] Inventors: Junichi Kai; Hiroshi Yasuda, both of Kawasaki; Kazutaka Taki, Shimizu; Mitsuhiro Nakano, Kasugai, all of Japan

[73] Assignee: Fujitsu Limited, Kawasaki, Japan

[21] Appl. No.: 924,638

[22] Filed: Aug. 4, 1992

[30] Foreign Application Priority Data

Aug. 6, 1991 [JP] Japan .................................. 3-196809

[51] Int. Cl.⁵ .......................................... H01J 37/302
[52] U.S. Cl. ............................. 250/492.22; 250/491.1
[58] Field of Search .............. 250/492.2, 492.22, 491.1

[56] References Cited

U.S. PATENT DOCUMENTS

| | | | |
|---|---|---|---|
| 4,362,942 | 12/1982 | Yasuda | 250/398 |
| 4,678,919 | 7/1987 | Sugishima et al. | 250/491.1 |
| 4,699,515 | 10/1987 | Tanimoto et al. | 356/401 |
| 4,812,661 | 3/1989 | Owen | 250/491.1 |
| 4,818,885 | 4/1989 | Davis et al. | 250/491.1 |
| 4,891,524 | 1/1990 | Yasuda et al. | 250/398 |
| 5,130,554 | 7/1992 | Nose et al. | 250/491.1 |
| 5,142,156 | 8/1992 | Ozawa et al. | 356/401 |
| 5,225,684 | 7/1993 | Taki et al. | 250/398 |

*Primary Examiner*—Bruce C. Anderson
*Attorney, Agent, or Firm*—Staas & Halsey

[57] ABSTRACT

A charged particle beam exposure method is used to draw a pattern on a substrate which is carried on a continuously moving stage by deflecting a charged particle beam. The method includes moving the stage in a direction parallel to an axis of a coordinate system of the substrate; generating first deflection data $D_1$ in a coordinate system of the stage by obtaining a position coordinate of an reference position of a pattern region including the pattern to be drawn relative to a target position of the stage, and for obtaining second deflection data $D_2$ in a coordinate system of the substrate describing a position coordinate of the pattern to be drawn from the reference position of the pattern region to which the pattern belongs; carrying out with respect to first deflection data $D_1$ a first correcting operation including correction of pattern distortion inherent to a charged particle beam exposure apparatus, and for carrying out the first correcting operation and a second correcting operation with respect to second deflection data $D_2$ after making a coordinate conversion to the coordinate system of the stage, where second correcting operation corrects a rotation error component relative to the stage caused by movement of the substrate; obtaining third deflection data $D_3'$ which describes a position coordinate of the pattern to be drawn from the present position of the stage by adding corrected first deflection data $D_1'$ and corrected second deflection data $D_2'$; and controlling a deflector based on third deflection data $D_3'$.

12 Claims, 11 Drawing Sheets

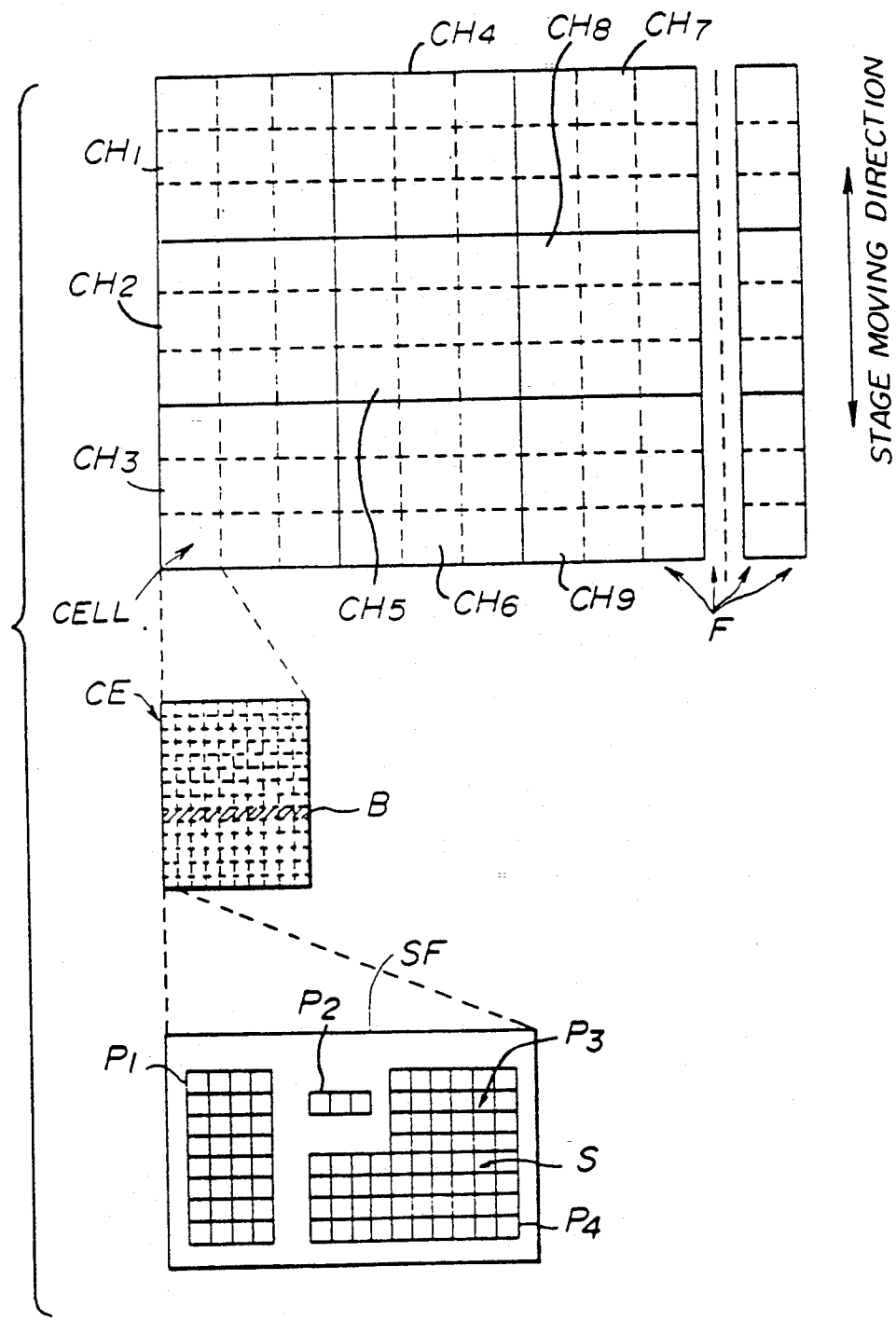

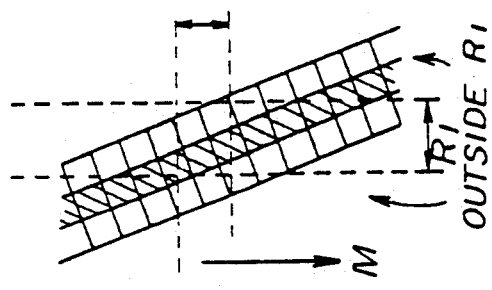
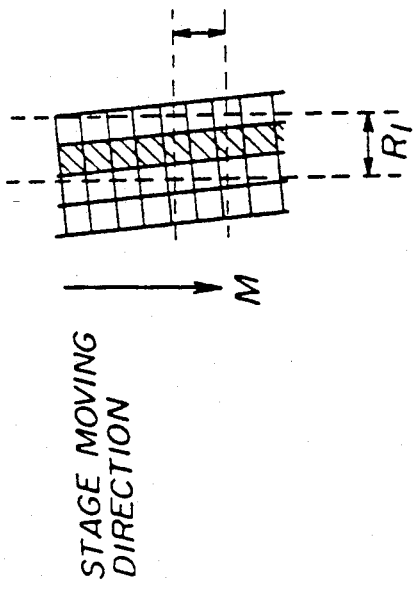

CHARGED PARTICLE BEAM EXPOSURE METHOD AND APPARATUS

BACKGROUND OF THE INVENTION

The present invention generally relates to charged particle beam exposure methods and apparatuses, and more particularly to a charged particle beam exposure method which draws a pattern by deflecting a charged particle beam when a stage moves continuously and to a charged particle beam exposure apparatus which employs such a charged particle beam exposure method.

The integration density and functions of semiconductor integrated circuits (ICs) are continuously improved and the IC technology is expected to form the core technology in technological progress for industry in general, including technical fields such as computers, communication systems and mechanical control systems. The integration density of the IC has increased by four times in the last couple of years, and in the case of a dynamic random access memory (DRAM), for example, the memory capacity has improved from 1 Mbit, 4 Mbit, 16 Mbit, 64 Mbit and 256 Mbit to 1 Gbit.

Such high integration density of the IC was made possible by improved technique in forming fine patterns. Due to improvement in the photolithography technique, it has become possible to form a pattern having a size of only 0.5 $\mu$m. However, there is a limit in reducing the size of the pattern by the photolithography technique, and a pattern having a size of approximately 0.4 $\mu$m is the smallest pattern that can be formed by the photolithography technique. For this reason, it is becoming increasingly difficult to guarantee an accuracy of 0.15 $\mu$m or less when forming windows for contact holes and aligning a pattern to an underlayer.

The charged particle beam exposure method was developed as an exposure method which can form a pattern which is finer than that formed by the photolithography technique. This charged particle beam exposure uses a charged particle beam typified by an electron beam. According to the charged particle beam exposure method, it is possible to form a finer pattern at a higher speed and with a higher reliability when compared to the photolithography technique. However, there are demands to further improve the accuracy of the charged particle beam exposure method.

In a charged particle beam exposure apparatus, a charged particle beam is deflected depending on a drawing pattern which is related to a pattern which is to be drawn on a substrate. The pattern is drawn on the substrate which is placed on a stage by irradiating the deflected charged particle beam on the substrate. The method of driving the stage can be divided into a step-and-repeat method and a continuously moving method.

According to the step-and-repeat method, the stage is stationary until the drawing of the pattern for one cell ends. The stage is moved when starting to drawn the pattern for the next cell. The patterns are drawn by repeating the operations of stopping the stage to draw one pattern and moving the stage before drawing the next pattern. But it takes considerable time to repeat the operations of stopping and moving the stage. On the other hand, according to the continuously moving method, the pattern is drawn while continuously moving the stage, and the drawing of the pattern is not stopped while the stage moves. In addition, it is unnecessary to align and connect the patterns between adjacent exposure regions as in the case of the step-and-repeat method because the pattern is drawn continuously. Therefore, compared to the step-and-repeat method, this continuously moving method can improve the speed and the accuracy of the exposure process. For this reason, the continuously moving method is the more desirable method for driving the stage.

When the substrate is placed on the stage, the coordinate system on the stage and the coordinate system on the substrate usually do not match. The main reasons for the difference in the two coordinate systems are the positioning error, which occurs when the substrate is placed on the stage, and the error in the position of a reference mark (or alignment marker), which is provided on the substrate. This reference mark is provided to measure the rotation of the substrate relative to the stage when the substrate is placed on the stage.

The positioning error which occurs when the substrate is placed on the stage is inevitable due to the error in the dimensions of a holder which fixes the substrate on the stage, because the dimension error and the like are inevitably introduced during the production process. In addition, the error in the position of the reference mark inevitably occurs when the reference mark is formed on the substrate. Accordingly, when carrying out the exposure process, it is necessary to correct the amount of deflection of the charged particle beam by taking into consideration the difference in the two coordinate systems.

For example, the patterns are drawn by assuming that chips $CH_1$ through $CH_8$ shown in FIG. 1 (A) are arranged on a substrate. Each of the chips $CH_1$ through $CH_8$ are a collection of cells CE shown in FIG. 1 (B). A column of cells CE along the stage moving direction is called a frame F.

For example, each cell CE has a size of approximately 2 mm square, and corresponds to a range in which a main deflector of the electron beam exposure apparatus can deflect the electron beam. The cell CE is a collection of sub fields SF shown in FIG. 1 (C). For example, each sub field SF has a size of approximately 100 $\mu$m square, and corresponds to a range in which a sub deflector of the electron beam exposure apparatus can deflect the electron beam. One row made up of the sub fields SF arranged in a direction perpendicular to the stage moving direction as shown in FIG. 1 (B) is called a band B.

As shown in FIG. 1 (C), the sub field SF is made up of patterns $P_1$ through $P_4$. In this example, there are four patterns, but it is of course possible to include an arbitrary number of patterns in the sub field SF. Each of the patterns $P_1$ through $P_4$ are made up of a plurality of shots S. For example, the shot S has a maximum size of approximately 3 $\mu$m square, and the size of the shot S can be varied arbitrarily by a slit deflector of the electron beam exposure apparatus.

FIG. 2 (A) shows a case where the coordinate system of the substrate such as that shown in FIG. 1 matches the coordinate system of the stage. FIG. 2 (A) shows a drawable range $R_1$ on the stage, in which the electron beam can be deflected by the main deflector, and a cell $CE_1$ on the substrate. In this case, a stage moving direction M matches the Y-axis of the coordinate system. A deflection data (vector) $D_3$ of the main deflector can be obtained from a vector sum of a deflection data (vector) $D_1$ from a column center position $O_1$ of the drawable range $R_1$ to a center position $CO_1$ of the cell $CE_1$, and a deflection data (vector) $D_2$ which indicates a position coordinate of the main deflector of the sub field to be drawn from the cell center position $CO_1$.

FIG. 2 (B) shows a case where the coordinate system of the substrate such as that shown in FIG. 1 does not match the coordinate system of the stage. In this case, if a wafer which is used as the substrate is relatively small and the difference between the two coordinate systems is relatively small, all of the main fields in each column fall within the drawable range $R_1$ as shown in FIG. 3 (A) as the stage moves in the stage moving direction M. Hence, it may be regarded that the electron beam exposure can be carried out with a high accuracy if the amount of deflection of the electron beam is corrected by taking into consideration the difference between the two coordinate systems.

However, even when the difference between the two coordinate systems is relatively small, there is a problem in that not all main fields in each column fall within the drawable range $R_1$ as the stage moves in the stage moving direction M as shown in FIG. 3 (B) if the substrate is relatively large. In other words, due to the difference between the two coordinate systems, there exists main fields for which the exposure process cannot be carried out, and as a result, the efficiency of the exposure process becomes poor. In the case where the difference between the two coordinate systems is relatively large, it only becomes possible to carry out the exposure process with respect to an extremely limited number of main fields of the substrate.

SUMMARY OF THE INVENTION

Accordingly, it is an object of the present invention to provide a novel and useful charged particle beam exposure method and apparatus in which the problems described above are eliminated.

Another object of the present invention is to provide a charged particle beam exposure method for drawing a pattern on a substrate which is carried on a continuously moving stage by deflecting a charged particle beam by a deflector means depending on the pattern which is to be drawn, which comprises the steps of (a) moving the stage in a direction parallel to an axis of a coordinate system of the substrate, (b) generating a first deflection data $D_1$ in a coordinate system of the stage by obtaining a position coordinate of a reference position of a pattern region which includes the pattern which is to be drawn relative to a target position of the stage, and for obtaining a second deflection data $D_2$ in the coordinate system of the substrate describing a position coordinate of the pattern which is to be drawn from the reference position of the pattern region to which the pattern belongs, (c) carrying out with respect to the first deflection data $D_1$ a first correcting operation which includes correction of a pattern distortion inherent to a charged particle beam exposure apparatus, and for carrying out the first correcting operation and a second correcting operation with respect to the second deflection data $D_2$ after making a coordinate conversion to the coordinate system of the stage, where second correcting operation corrects a rotation error component relative to the stage caused by the movement of the substrate, (d) obtaining a third deflection data $D_3'$ which describes a position coordinate of the pattern which is to be drawn from the present position of the stage by adding a corrected first deflection data $D_1'$ and a corrected second deflection data $D_2'$ which are obtained in the step (c); and (e) controlling the deflector means based on the third deflection data $D_3'$. According to the charged particle beam exposure method of the present invention, the stage is moved in the direction parallel to the axis of the coordinate system of the substrate. For this reason, all of the main fields will always fall within the drawable range when the stage moves, regardless of the size of the substrate and the size of the difference between the coordinate system of the stage and the coordinate system of the substrate. As a result, it is possible to carry out a satisfactory exposure process with respect to all of the main fields on the substrate. In addition, the correcting operations are carried out independently for the first and second deflection data $D_1$ and $D_2$. Thus, it is possible to always obtain the third deflection data $D_3'$ which is subjected to a correct correcting operation. Therefore, the deflecting position of the charged particle beam can be accurately corrected based on the third deflection data $D_3'$.

Still another object of the present invention is to provide a charged particle beam exposure apparatus comprising a movable stage which carries a substrate, stage moving means for continuously moving the stage in a direction parallel to an axis of a coordinate system of the substrate, a charged particle beam generating source for generating a charged particle beam, deflector means for deflecting the charged particle beam depending on a pattern which is to be drawn and for drawing the pattern on the substrate by the deflected charged particle beam, generating means for generating a first deflection data $D_1$ in a coordinate system of the stage by obtaining a position coordinate of a reference position of a pattern region which includes the pattern which is to be drawn relative to a target position of the stage, obtaining means for obtaining a second deflection data $D_2$ in a coordinate system of the substrate describing a position coordinate of the pattern which is to be drawn from the reference position of the pattern region to which the pattern belongs, first correcting operation means for carrying out with respect to the first deflection data $D_1$ a first correcting operation which includes correction of a pattern distortion inherent to the charged particle beam exposure apparatus, second correcting operation means for carrying out the first correcting operation and a second correcting operation with respect to the second deflection data $D_2$ after making a coordinate conversion to the coordinate system of the stage, where the second correcting operation corrects a rotation error component relative to the stage caused by the movement of the substrate, and adding means for obtaining a third deflection data $D_3'$ which describes a position coordinate of the pattern which is to be drawn from the present position of the stage by adding a corrected first deflection data $D_1'$ which is obtained from the first correcting operation means and a corrected second deflection data $D_2'$ which is obtained from the second correcting operation means, where the deflector means is controlled based on the third deflection data $D_3'$. According to the charged particle beam exposure apparatus of the present invention, the stage is moved in the direction parallel to the axis of the coordinate system of the substrate. For this reason, all of the main fields will always fall within the drawable range when the stage moves, regardless of the size of the substrate and the size of the difference between the coordinate system of the stage and the coordinate system of the substrate. As a result, it is possible to carry out a satisfactory exposure process with respect to all of the main fields on the substrate. In addition, the correcting operations are carried out independently for the first and second deflection data $D_1$ and $D_2$. Thus, it is possible to always obtain the third deflection data $D_3'$ which is subjected to a correct correcting operation. Therefore, the deflecting position of the charged particle beam can be accurately corrected based on the third deflection data $D_3'$.

Other objects and further features of the present invention will be apparent from the following detailed description when read in conjunction with the accompanying drawings.

BRIEF DESCRIPTION OF THE DRAWINGS

FIG. 1 is a diagram for explaining terms used in an electron beam exposure process;

FIG. 3 is a diagram for explaining the relationship between a main field and a drawable range;

DESCRIPTION OF THE PREFERRED EMBODIMENTS

Figure 4:
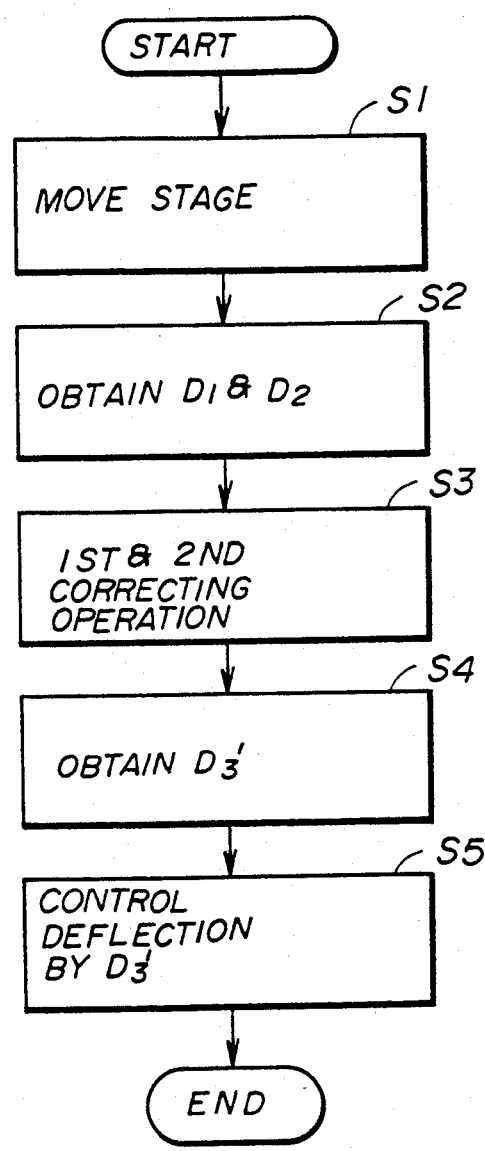
FIG. 4 is a flow chart for explaining the operating principle of a charged particle beam exposure method according to the present invention.

First, a description will be given of the operating principle of a charged particle beam exposure method according to the present invention, by referring to FIG. 4.

According to the charged particle beam exposure method according to the present invention, a stage which carries a substrate is continuously moved, and a pattern is drawn on the substrate by a charged particle beam by deflecting the charged particle beam by a deflector means depending on the pattern which is to be drawn. In the flow chart shown in FIG. 4, a step S1 moves the stage in a direction parallel to an axis of a coordinate system of the substrate. A step S2 calculates a first deflection data $D_1$ by making a subtraction between a target position of the stage and a present position of the stage, and obtains a second deflection data $D_2$ which indicates a position coordinate of the pattern which is to be drawn from a center position of a pattern group to which the pattern belongs. A step S3 carries out a first correcting operation with respect to the first deflection data $D_1$ so that it is described in a coordinate system of the stage, and carries out the first correcting operation and a second correcting operation with respect to the second deflection data $D_2$ so that a rotation error component of the substrate relative to the stage is described in the coordinate system of the stage. A step S4 adds a corrected first deflection data $D_1'$ and a corrected second deflection data $D_2'$ to obtain a third deflection data $D_3'$, which describes the position coordinate of the pattern which is to be drawn from the present position of the stage. In addition, a step S5 controls the deflector means based on the third deflection data $D_3'$.

According to the charged particle beam exposure method of the present invention, the stage is moved in the direction parallel to the axis of the coordinate system of the substrate. For this reason, all of the main fields will always fall within the drawable range when the stage moves, regardless of the size of the substrate and the size of the difference between the coordinate system of the stage and the coordinate system of the substrate. As a result, it is possible to carry out a satisfactory exposure process with respect to all of the main fields on the substrate. In addition, the correcting operations are carried out independently for the first and second deflection data $D_1$ and $D_2$. Thus, it is possible to always obtain the third deflection data $D_3'$, which is subjected to a correct correcting operation. Therefore, the deflecting position of the charged particle beam can be accurately corrected based on the third deflection data $D_3'$.

Next, a description will be given of an operating principle of a charged particle beam exposure apparatus according to the present invention, by referring to FIG. 5.

Figure 5:
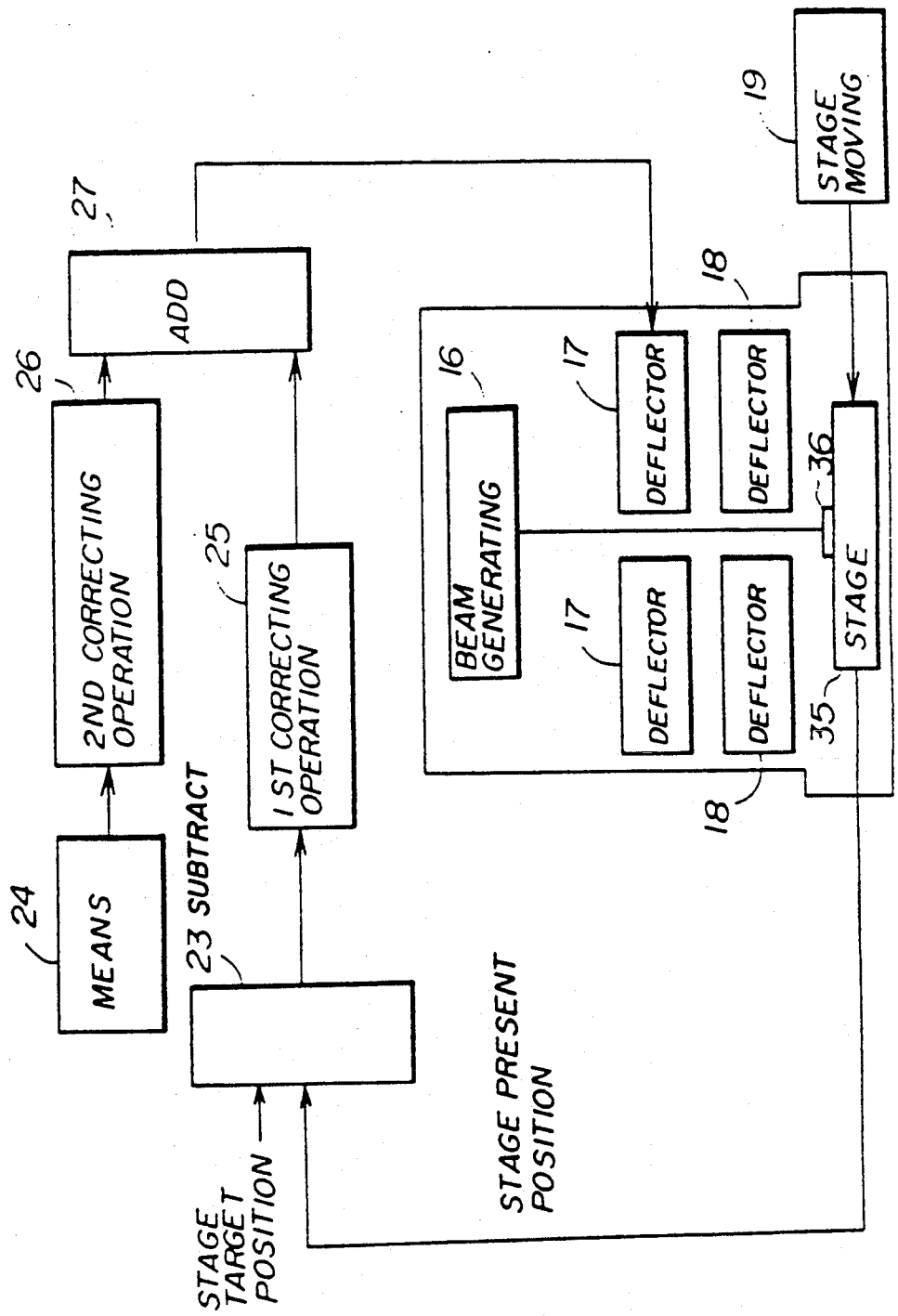
FIG. 5 is a system block diagram for explaining the operating principle of a charged particle beam exposure apparatus according to the present invention.

The charged particle beam exposure apparatus shown in FIG. 5 includes a stage 35 which carries a substrate 36, a stage moving means 19, a charged particle beam generating source 16 for generating a charged particle beam, a deflector means made up of an electromagnetic deflector 17 and an electrostatic deflector 18, a subtracting means 23, a $D_2$ obtaining means 24, a first correcting operation means 25, a second correcting operation means 26, and an adder means 27.

The stage moving means 19 continuously moves the stage 35 in a direction parallel to an axis of a coordinate system of the substrate 36. The deflector means 17, 18 deflects the charged particle beam depending on the pattern which is to be drawn and draws the pattern on the substrate 36 by the charged particle beam. The subtracting means 23 makes a subtraction between a target position of the stage 35 and a present position of the stage 35 to calculate a first deflection data $D_1$. The $D_2$ obtaining means 24 obtains a second deflection data $D_2$ which describes the position coordinate of the pattern which is to be drawn from a center position of a pattern group to which the pattern belongs.

The first correcting operation means 25 carries out a first correcting operation with respect to the first deflection data $D_1$ so that it is described in a coordinate system of the stage 35. The second correcting operation means 26 carries out the first correcting operation and a second correcting operation with respect to the second deflection data $D_2$ so that a rotation error component of the substrate 36 relative to the stage 35 is described in the coordinate system of the stage 35. The adder means 27 adds a corrected first deflection $D_1'$ and a corrected second deflection data $D_2'$ to obtain a third deflection data $D_3$ which describes the position coordinate of the pattern which is to be drawn from the present position of the stage 35. The deflector means 17, 18 is controlled based on the third deflection data $D_3'$.

According to the charged particle beam exposure apparatus of the present invention, the stage 35 is moved in the direction parallel to the axis of the coordinate system of the substrate 36. For this reason, all of the main fields will always fall within the drawable range when the stage 35 moves, regardless of the size of the substrate 36 and the size of the difference between the coordinate system of the stage 35 and the coordinate system of the substrate 36. As a result, it is possible to carry out a satisfactory exposure process with respect to all of the main fields on the substrate 36. In addition, the correcting operations are carried out independently for the first and second deflection data $D_1$ and $D_2$. Thus, it is possible to always obtain the third deflection data $D_3'$ which is subjected to a correct correcting operation. Therefore, the deflecting position of the charged particle beam can be accurately corrected based on the third deflection data $D_3'$.

Figure 6:
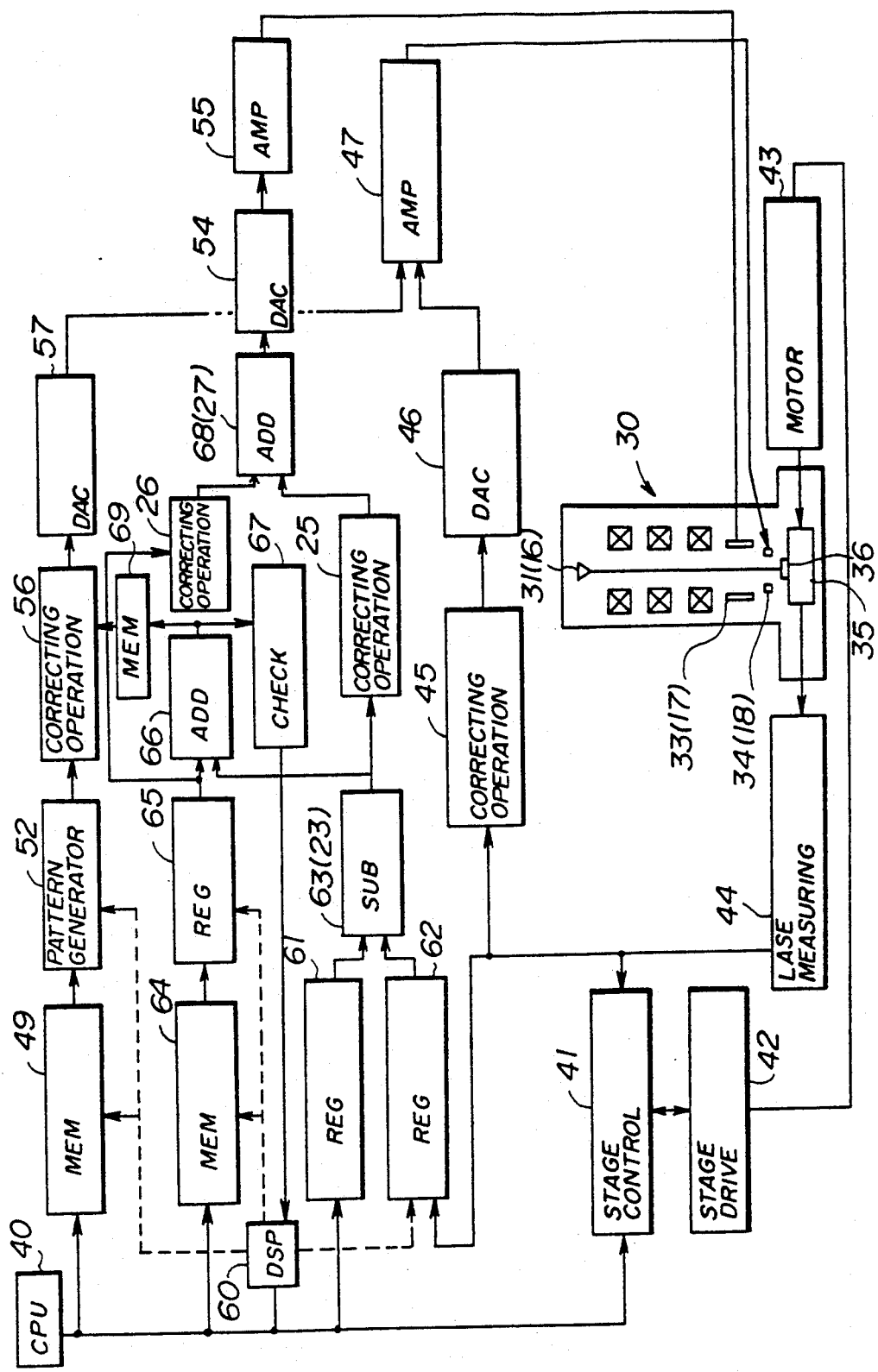
FIG. 6 is a system block diagram showing a first embodiment of the charged particle beam exposure apparatus according to the present invention.
Figure 7C:
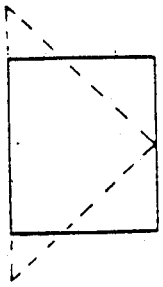
FIG. 7 is a diagram for explaining correction coefficients.
Figure 7B:
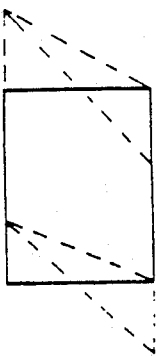
Figure 7A:
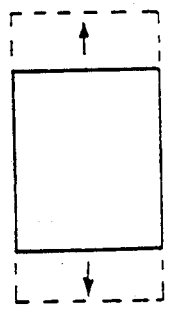
Figure 7D:
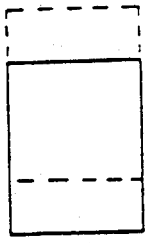

Next, a description will be given of a first embodiment of the charged particle beam exposure apparatus according to the present invention, by referring to FIG. 6. FIG. 6 shows the structure of the first embodiment. In this embodiment, the present invention is applied to an electron beam exposure apparatus.

In FIG. 6, an electron beam exposure part 30 includes a stage 35, and an electron optical system which includes an electron gun 31, an electron lens 32, a slit deflector (not shown) made up of an electrostatic deflector, a main deflector 33 made up of an electromagnetic deflector and a sub deflector 34 made up of an electrostatic deflector. The stage 35 is movable in both X and Y direction of the coordinate system of the stage 35. A substrate 36 such as a wafer is placed on the stage 35 so that the stage 35 carries the substrate 36.

Figure 2A:
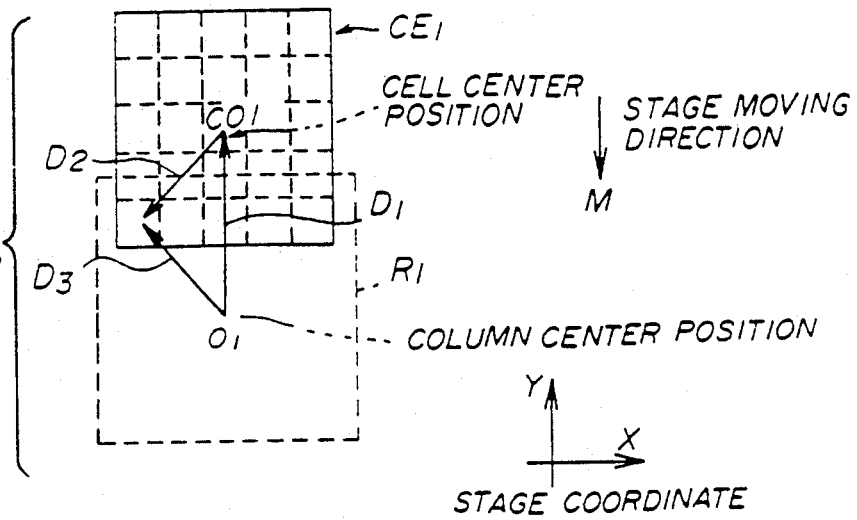
FIG. 2 is a diagram for explaining a rotation of a substrate relative to a stage.
Figure 2B:
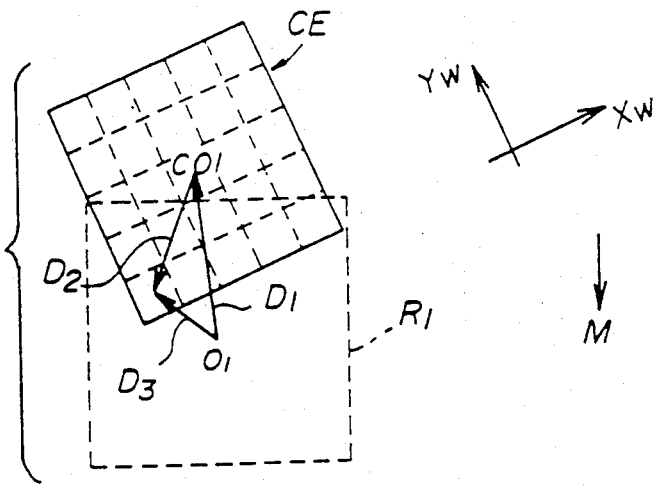

In this embodiment, the moving direction of the stage 35 matches a Yw axis of the coordinate system of the substrate 36 in FIG. 2 (B). For this reason, all of the main fields of the substrate 36 always fall within the drawable range $R_1$ when the stage 35 moves, regardless of the size of the substrate 36 and the size of the difference between the X-Y coordinate system of the stage 35 and the Xw-Yw coordinate system of the substrate 36. Accordingly, it is possible to carry out a satisfactory exposure process with respect to all of the main fields of the substrate 36.

For the sake of convenience, it will be assumed that the chips $CH_1$ through $CH_8$ are arranged on the substrate 36 as shown in FIG. 1. In this case, the size of the cell CE corresponds to the range in which the electron beam can be deflected by the main deflector 33. In addition, the size of the sub field SF corresponds to the range in which the electron beam can be deflected by the sub deflector 34.

A central processing unit (CPU) 40 generates a drawing data related to the pattern which is to be drawn, and controls each part of the electron beam exposure apparatus so as to draw this pattern on the substrate 36. An output control signal of the CPU 40 is applied to a motor 43 via a stage controller 41 and a stage drive 42, and the stage 35 is moved to a desired position by controlling the rotation of the motor 43. The continuously moving method described above is employed in this embodiment as the method of driving the stage 35.

The position of the continuously moving stage 35 is measured by a laser measuring equipment 44, and an output measured signal of the laser measuring equipment 44 is supplied to the stage controller 41. The stage controller 41 generates a stage control signal which is dependent on an error between the control signal from the CPU 40 and the measured signal from the laser measuring equipment 44, and controls the stage drive 42. The measured signal from the laser measuring equipment 44 is also supplied to a stage feedback correcting operation circuit 45 and a stage position read register 62 which will be described later.

The stage feedback correcting operation circuit 45 carries out a predetermined correcting operation with respect to a signal from the laser measuring equipment 44. A correcting operation result from the stage feedback correcting operation circuit 45 is supplied to a sub deflector digital-to-analog converter (DAC) 46 and is converted into an analog signal before being applied as a deflection voltage to the sub deflector 34 via a sub deflection amplifier 47.

The position coordinate of each sub field input to the main deflector 33 is stored in a main buffer memory 64 as the pattern data. In addition, the pattern data inside the corresponding sub field is stored in a sub buffer memory 49. The pattern data stored in the main and sub buffer memories 64 and 49 are read out based on a control pulse from a digital signal processor (DSP) 50 which carries out a predetermined operation based on the output control signal of the CPU 40.

A stage target value register 61 stores a stage target value which is received from the CPU 40. The stage target value describes the position of the stage 35 where the center of the main field should be located. The stage position read register 62 receives and stores a signal from the laser measuring equipment 44 describing the position coordinate of the stage 35 at a certain instant of time.

A subtracting circuit 63 makes a subtraction between the target value which is stored in the stage target value register 61 and the stage position coordinate which is stored in the stage position read register 62, and calculates a deflection data (vector) $D_1$ shown in FIG. 2. The main buffer memory 64 stores the position coordinate of the pattern which is to be drawn from the center position of the pattern group to which this pattern belongs, that is, a deflection data (vector) $D_2$ shown in FIG. 2. The deflection data $D_2$ is read into a main deflecting position register 65 and is supplied to an adding circuit 66. Hence, the adding circuit 66 outputs a deflection data (vector) $D_3$ shown in FIG. 2. A drawable range check part 67 checks whether or not the deflecting position of the electron beam falls within the drawable range $R_1$ shown in FIG. 2 based on the deflection data $D_3$ which is received from the adding circuit 66, and outputs a detection signal to the DSP 60.

The sub buffer memory 49 stores the pattern data of the corresponding sub field. The pattern generator 52 generates a shot data of the pattern which is to be drawn based on the pattern data stored in the sub buffer memory 49, and supplies the shot data to a sub correcting operation circuit 56. The main deflector coordinate prior to the correction, that is, the deflection data $D_3$ which is output from the adding circuit 66, is supplied to a correction memory 69 as an address. Accordingly, the sub correcting operation circuit 56 carries out a correcting operation with respect to the shot data using correction coefficients which are determined depending on the main deflector coordinate and are read out from the correction memory 69 by the deflection data $D_3$ which is used as the address, and eliminates the distortion of the pattern. A correcting operation result, which is obtained from the sub correcting operation circuit 56, is supplied to a sub deflector DAC 57 and is converted into an analog signal before being applied as a deflection voltage to the sub deflector 34 via the sub deflection amplifier 47.

A stage correcting operation circuit 25 carries out a predetermined correcting operation with respect to the deflection data $D_1$ which is obtained from the subtracting circuit 63. A correcting operation result, that is, a corrected deflection data $D_1'$, is supplied to an adding circuit 68 from the stage correcting operation circuit 25. On the other hand, a cell correcting operation circuit 26 carries out a predetermined correcting operation with respect to the deflection data $D_2$ which is obtained from the main deflecting position register 65. A correcting operation result that is, a corrected deflection data $D_2'$, is supplied to the adding circuit 68 from the cell correcting operation circuit 26.

Accordingly, the adding circuit 68 adds the corrected deflection data $D_1'$ and $D_2'$ and obtains a corrected deflection data $D_3'$. This corrected deflection data $D_3$ is supplied to the main deflector 33 via the main deflection amplifier 55, and the electron beam is deflected in a direction perpendicular to the moving direction of the stage 35 depending on the corrected deflection data $D_3'$.

Next, a description will be given of the reason for independently carrying out the correcting operations with respect to the deflection data $D_1$ and $D_2$ before adding the same to obtain the deflection data $D_3'$.

First, the deflection data $D_1$ and $D_3$ respectively are described in the X-Y coordinate system of the stage 35. But the deflection data $D_2$ is described in the Xw-Yw coordinate system of the substrate 36. For this reason, if the same correcting operation is carried out with respect to the deflection data $D_1$ and $D_2$ or the correcting operation is carried out with respect to the deflection data $D_3$, it is impossible to obtain the deflection data $D_3'$ which is corrected in a correct manner.

Accordingly, it is necessary to first convert the deflection data $D_2$ into the data in the X-Y coordinate system of the stage 35. Then, because the exposure apparatus includes an error inherent thereto and which error distorts the shape of the pattern which is to be drawn, the first correcting operation is carried out with respect to the deflection data $D_1$ and the coordinate-converted deflection data $D_2$ in order to correct this error. Furthermore, since the stage 35 is moved in the direction parallel to the axis of the Xw-Yw coordinate of the substrate 36 in the present invention, a rotation error is introduced with respect to the X-Y coordinate system of the stage 35 due to this movement of the stage 35. As described above, the deflection data $D_1$ is obtained in the X-Y coordinate system of the stage 35 because it is obtained as the measured result of the laser measuring equipment 44. For this reason, the rotation error caused by the movement of the stage 35 is already included in the deflection data $D_1$. But on the other hand, the deflection data $D_2$ is in the Xw-Yw coordinate system of the substrate 36. It is thus necessary to correct the rotation error caused by the movement of the stage 35, that is, it is necessary to carry out the second correcting operation with respect to the deflection data $D_2$.

In other words, in the present invention, only the first correcting operation is carried out with respect to the deflection data $D_1$, but the coordinate system conversion and the first and second correcting operations carried out with respect to the deflection data $D_2$. The corrected deflection data $D_1'$ and $D_2'$ which are obtained by independently carrying out the correcting operations are finally added, so as to obtain the deflection data $D_3'$ which is used as the control signal with respect to the main deflector 33.

Hence, this embodiment carries out the first correcting operation with respect to the deflection data $D_1$. This deflection data $D_1$ is obtained based on the output of the laser measuring equipment 44, and the output of the laser measuring equipment 44 is the data which includes all errors of the stage 35 related to the pattern drawing. This first correcting operation is peculiar to the exposure apparatus and is independent of the rotation error of the substrate 36 relative to the stage 35, that is, the difference between the two coordinate systems. On the other hand, since a different positioning error occurs every time the substrate 36 is placed on the stage 35, the correcting operation with respect to the deflection data $D_2$ differs for each substrate 36.

The correction of the rotation error inherent to the electron beam exposure apparatus is included in the first correcting operation. On the other hand, the correction of the rotation error caused by the difference between the two coordinate systems and the correction of the rotation error caused by the moving stage 35 are included in the second correcting operation.

Returning now to the description of FIG. 6, the stage correcting operation circuit 25 carried out the first correcting operation in this embodiment. More particularly, with respect to the deflection data $D_1 = (X_{SIN}, Y_{SIN})$, the corrected deflection data $D_1' = (X_{SOUT}, Y_{SOUT})$ is obtained by using the following formulas (1) and (2), where $G_{SX}$ and $G_{SY}$ denote gain correction coefficients, $R_{SX}$ and $R_{SY}$ denote rotation correction coefficients, $H_{SX}$ and $H_{SY}$ denote trapezoidal correction coefficients, $O_{SX}$ and $O_{SY}$ denote offset correction coefficients, and subscripts X and Y of each correction coefficient respectively indicate the X and Y directions in the X-Y coordinate system of the stage 35.

$$X_{SOUT} = (1 + G_{SX})X_{SIN} + R_{SX}Y_{SIN} + H_{SX}X_{SIN}Y_{SIN} + O_{SX} \quad (1)$$

$$Y_{SOUT} = (1 + G_{SY})Y_{SIN} + R_{SY}X_{SIN} + H_{SY}Y_{SIN}X_{SIN} + O_{SY} \quad (2)$$

In this embodiment, 8 kinds of actual measured values are obtained in advance for $X_{SIN}$, $Y_{SIN}$, $X_{SOUT}$ and $Y_{SOUT}$, and each of the correction coefficients which are obtained by substituting the actual measured values into the formulas (1) and (2) are prestored in registers (not shown) within the stage correcting operation circuit 25.

FIG. 7 is a diagram for explaining the correction coefficients $G_{SX}$, $G_{SY}$, $R_{SX}$, $R_{SY}$, $H_{SX}$, $H_{SY}$, $O_{SX}$ and $O_{SY}$. For the sake of convenience, a description will be given of the correction with respect to the X direction of the stage 35. In FIG. 7, the gain correction coefficient $G_{SX}$ is used to correct a rectangular data which is indicated by a broken line in (a) and requires correction into a corrected rectangular data indicated by a solid line, for example. Similarly, the rotation correction coefficient $R_{SX}$, the trapezoidal correction coefficient $H_{SX}$ and the offset correction coefficients $O_{SX}$ are respectively used to correct rectangular data which are indicated by broken lines in (b), (c) and (d) and require correction into corrected rectangular data indicated by solid lines.

Figure 8:
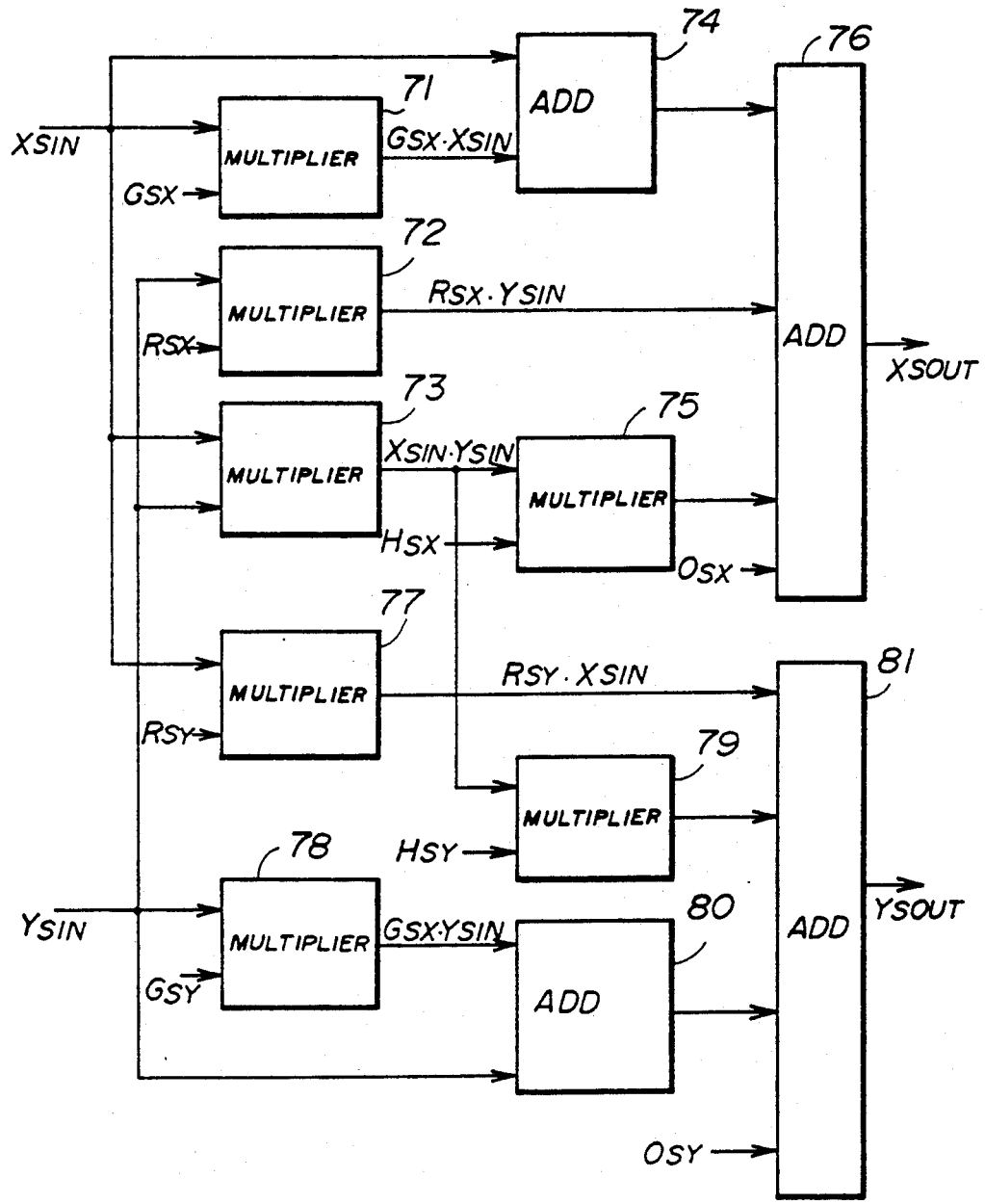
FIG. 8 is a system block diagram showing an embodiment of a stage correcting operation circuit shown in FIG. 6.

FIG. 8 shows an embodiment of the stage correcting operation circuit 25. The stage correcting operation circuit 25 includes multipliers 71 through 73, 75 and 77 through 79, and adders 74, 76, 80 and 81 which are connected as shown. The stage difference value $X_{SIN}$ is input to one input terminal of each of the multipliers 71, 73 and 77. The stage difference value $Y_{SIN}$ is applied to the other input terminal of each of the multipliers 72, 73 and 78. Values described by $G_{SX}X_{SIN}$, $R_{SX}X_{SIN}$, $X_{SIN}Y_{SIN}$ and $R_{SY}X_{SIN}$ are respectively obtained from the multipliers 71, 72, 73 and 77.

The adder 74 address the output of the multiplier 71 and the stage difference value $X_{SIN}$ and outputs a value described by $(1+G_{SX})X_{SIN}$. The multiplier 75 multiplies the output of the multiplier 73 and the trapezoidal correction coefficient $H_{SX}$ and outputs a value described by $H_{SX}X_{SIN}Y_{SIN}$. The trapezoidal correction coefficient $H_{SX}$ and the other correction coefficients are prestored in the registers of the stage correcting operation circuit 25 as described above. The adder 76 adds the output of the adder 74, the outputs of the multipliers 72 and 75, and the offset correction coefficient $O_{SX}$, and outputs the stage correction output $X_{SOUT}$ which is described by the formula (1).

The multiplier 78 multiplies the gain correction coefficient $G_{SY}$ and the stage difference value $Y_{SIN}$. The multiplier 79 multiplies the output of the multiplier 73 and the trapezoidal correction coefficient $H_{SY}$. The adder 81 adds the values $R_{SY}X_{SIN}$ output from the multiplier 77, the value $(1+G_{SY})Y_{SIN}$ output from the adder 80, the value $H_{SY}X_{SIN}Y_{SIN}$ output from the multiplier 79 and the offset correction coefficient $O_{SY}$, and outputs the stage correction output $Y_{SOUT}$ which is described by the formula (2).

On the other hand, the cell correcting operation circuit 26 shown in FIG. 6 carries out the correcting operation described by the following formulas (3) and (4) with respect to the deflection data $D_2=(X_{CIN}, Y_{CIN})$ which is obtained from the main deflection position register 65, and obtains the corrected deflection data $D_2'=(X_{COUT}, Y_{COUT})$.

$$X_{COUT} = (1 + G_{CX})X_{CIN} + R_{CX}Y_{CIN} + H_{CX}X_{CIN}Y_{CIN} + O_{CX} \quad (3)$$

$$Y_{COUT} = (1 + G_{CY})X_{CIN} + R_{CY}X_{CIN} + H_{CY}Y_{CIN}X_{CIN} + O_{CY} \quad (4)$$

In the above formulas (3) and (4), $G_{CX}$ and $G_{CY}$ denote gain correction coefficients, $R_{CX}$ and $R_{CY}$ denote rotation correction coefficients, $H_{CX}$ and $H_{CY}$ denote trapezoidal correction coefficients, $O_{CX}$ and $O_{CY}$ denote offset correction coefficients, and subscripts X and Y of each correction coefficient respectively indicate the X and Y directions in the X-Y coordinate system of the stage 35.

In this embodiment, the cell correcting operation circuit 26 carries out the first and second correcting operations described above. Accordingly, by appropriately setting the values for the rotation correction coefficients $R_{CX}$ and $R_{CY}$ and the like, the correction of the rotation error caused by the difference between the two coordinate systems and the rotation error caused by the moving stage 35 are both corrected by the cell correcting operation circuit 26.

The cell correcting operation circuit 26 has a structure similar to that of the stage correcting operation circuit 25 shown in FIG. 8. But in the case of the cell correcting operation circuit 26, the values of the correction coefficients are of course selected differently from the stage correcting operation circuit 25. Because the correcting operation circuits 25 and 26 actually carry out the operations by a pipeline processing, the operation results are obtained after predetermined number of clocks.

Figure 9:
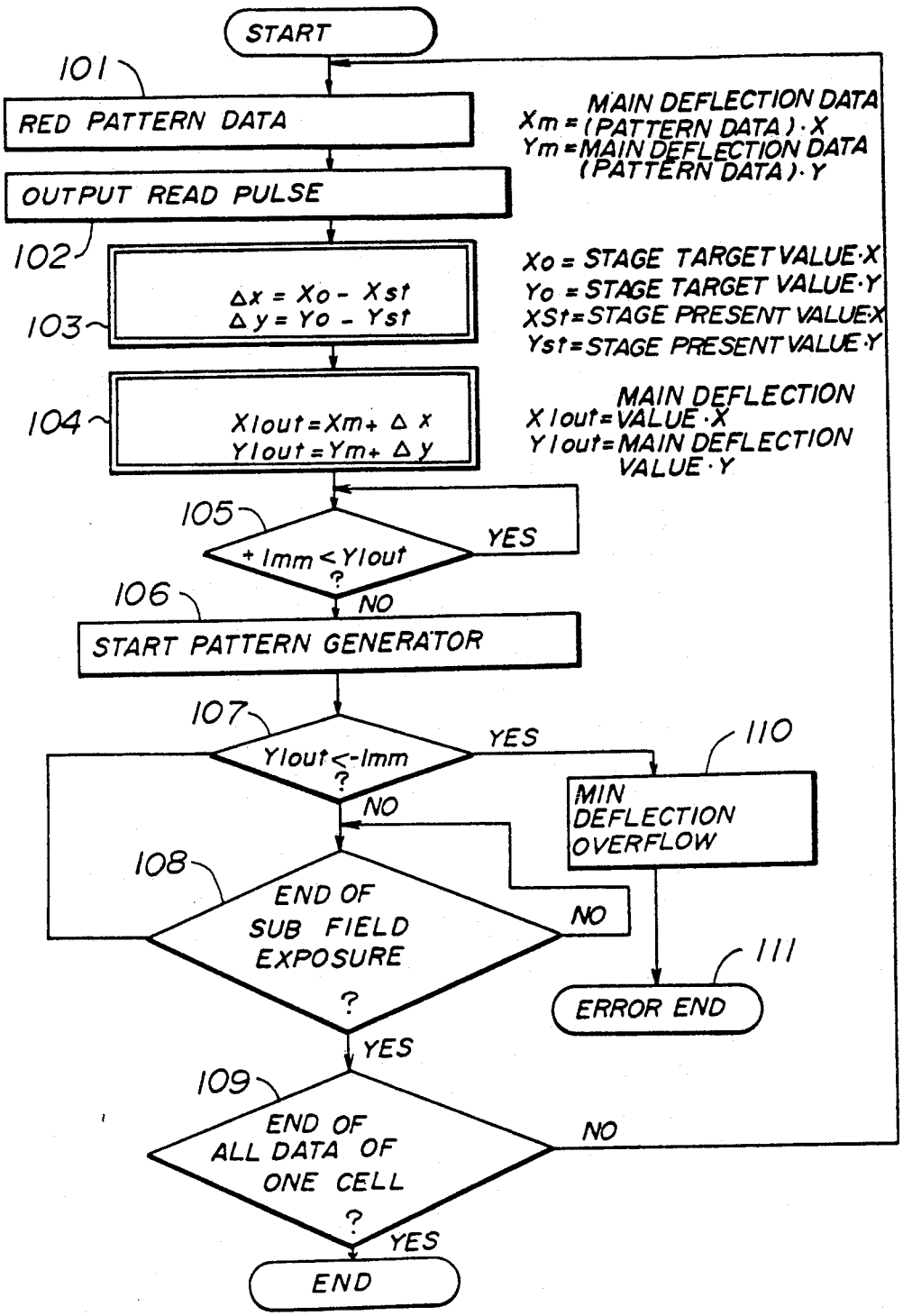
FIG. 9 is a flow chart for explaining the operation of the first embodiment of the charged particle beam exposure apparatus according to the present invention.
Figure 10:
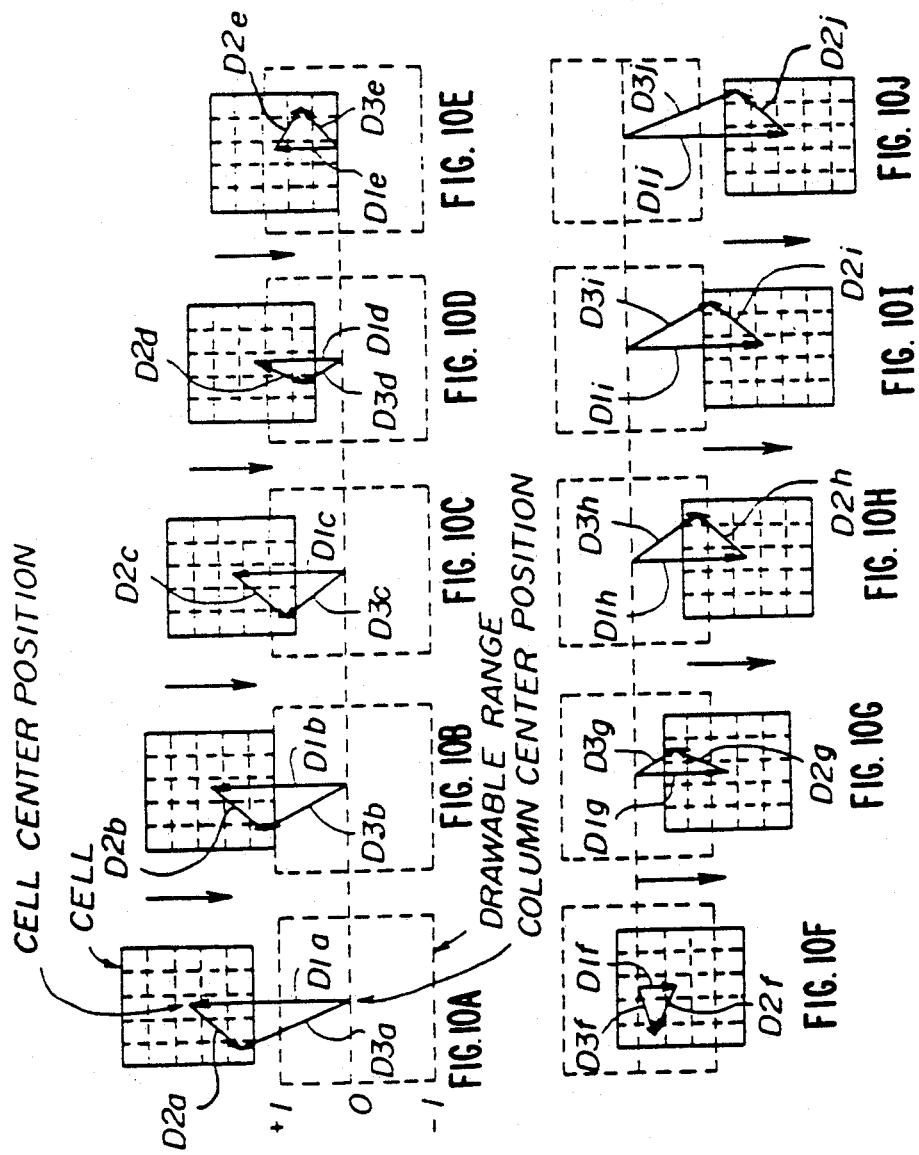
FIG. 10 is a diagram for explaining the relationship between a stage and a deflection made by a main deflector.

Next, a more detailed description will be given of the operation of this embodiment, by referring to FIGS. 9 and 10. FIG. 9 is a flow chart for explaining the operation of this embodiment, and FIG. 10 is a diagram for explaining the relationship between the stage 35 and the main deflection.

In FIG. 6, the main buffer memory 64 stores the deflection data $D_2$ which indicates the position coordinate of the pattern which is to be drawn from the center position of the pattern group to which this pattern belongs. In addition, the sub buffer memory 49 stores the pattern data inside the corresponding sub field. The stage target value register 61 stores the target position of the stage 35.

In this state, prior to the drawing of the main field, the DSP 60 reads the deflection data $D_2$ from the main buffer memory 64 and instructs reading of the deflection data $D_2$ into the main deflection position register 65 in a step 101 shown in FIG. 9. As a result, the main deflection data $X_m$, $Y_m$ are stored in the main deflection position register 65.

Then, the DSP 60 supplies a read pulse to the stage position read register 62 in a step 102 shown in FIG. 9. Hence, the position coordinate of the stage 35 at this instant in time is supplied from the laser measuring equipment 44 to the stage position read register 62 and stored in the stage position read register 62.

Thereafter, the subtracting circuit 63 calculates the difference values $\Delta x$ and $\Delta y$ between the stage target values $X_0$ and $Y_0$ from the stage target value register 61 and the present stage values $X_{st}$ and $Y_{st}$ from the stage position read register 62 in a step 103 shown in FIG. 9, based on the following formulas (5) and (6).

$$\Delta x = X_0 - X_{st} \quad (5)$$

$$\Delta y = Y_0 - Y_{st} \quad (6)$$

The stage difference values $\Delta x$ and $\Delta y$ include the error component caused by the error of the lens in the electron optical system, the error in the magnetic field of the main deflector 33, the error in the electric field of the sub deflector 34, and the error caused by the production and assembling accuracy of the main deflector 33. Hence, the stage difference values $\Delta x$ and $\Delta Y$ are constant regardless of the rotation of the substrate 36 unless a change occurs with time. The stage difference values $\Delta x$ and $\Delta y$ are input to the stage correcting operation circuit 25 as the stage correction inputs $X_{SIN}$ and $Y_{SIN}$, and the stage correcting operation circuit 25 carries out the correcting operation based on the formulas (1) and (2). The stage difference values $\Delta x$ and $\Delta y$ are also supplied to the adding circuit 66.

The adding circuit 66 adds the stage difference values $\Delta x$ ($=X_{SIN}$) and $\Delta y$ ($=Y_{SIN}$) and the main deflection data $X_m$ and $Y_m$ from the main deflection position register 65, and calculates the main deflection values $X_{IOUT}$ and $Y_{IOUT}$ in a step 104 shown in FIG. 9. The main deflection values $X_{IOUT}$ and $Y_{IOUT}$ correspond to the error component caused by the rotation of the substrate 36 relative to the stage 35, and are different for each substrate 36. The main deflection values $X_{IOUT}$ and $Y_{IOUT}$ are supplied to the correction memory 69 and the drawable range check part 67. The main deflection data $X_m$ and $Y_m$ from the main deflection position register 65 are supplied to the cell correcting operation circuit 26 as the cell correction input data $X_{CIN}$ and $Y_{CIN}$ and are subjected to the correcting operation based on the formulas (3) and (4).

At the same time as the start of the stage correcting operation and the cell correcting operation, the drawable range check part 67 checks in a step 105 shown in FIG. 9 whether or not $Y_{IOUT}$ which is parallel to the stage moving direction out of the main deflection values prior to the correcting operations falls within (maximum value of the drawable range)+1 mm.

If it is assumed that the stage 35 continuously moves from the top to bottom in FIG. 10 along the Y direction and the drawable range is the rectangular region indicated by a broken line in FIG. 10, the drawable range check part 67 decides that $Y_{IOUT}$ is outside the drawable range because the Y-axis direction component $Y_{IOUT}$ of the main deflection values $D_{3a}$ and $D_{3b}$ in FIG. 10 (a) and (b) respectively are greater than 1 mm. Hence, the exposure operation is waited in this case.

The stage 35 thereafter moves from the state shown in FIG. 10 (b) and the relative positional relationship between the cell position and the drawable range successively changes as shown in FIG. 10 (c), (d), (e), (f), (g), (h), (i) and (j). The drawable range check part 67 decides that $Y_{IOUT}$ is within the drawable range when the positional relationship becomes as shown in FIG. 10(c) because $Y_{IOUT} \leq 1$ mm in this case. In this case, the DSP 60 starts the pattern generator 52 in a step 106 shown in FIG. 9 so that the pattern generator 52 generates the shot data based on the pattern data which is within the sub field to be drawn and is obtained from the sub buffer memory 49.

As a result, the shot data is supplied to the sub deflector 34 via the sub correcting operation circuit 56, the sub deflection DAC 57 and the sub deflection amplifier 47, and the exposure operation is started. In this state, the added correcting operation values ($X_{SOUT}+X_{COUT}$) and ($Y_{SOUT}+Y_{COUT}$) from the adding circuit 68 are supplied to the main deflector 33 via a main deflection DAC 54 and a main deflection amplifier 55, and the electron beam is deflected in a direction perpendicular to the moving direction of the stage 35.

The stage difference values change as the stage 35 moves as indicated by $D_{1a}$ through $D_{1j}$ in FIG. 10 (a) through (j). In addition, the main deflection data ($X_m$, $Y_m$) change as indicated by $D_{2a}$ through $D_{2j}$ in FIG. 10 (a) through (j). Each sub field of the cell which is to be drawn is successively drawn as the stage difference values and the main deflection data change in this manner. The drawable range check part 67 also checks in a step 107 shown in FIG. 9 whether or not the Y-axis direction component $Y_{IOUT}$ of the main deflection values $D_{3a}$ through $D_{3j}$ is smaller than (maximum value of the drawable range)−1 mm. If $Y_{IOUT} \geq$ (maximum value of the drawable range)−1 mm, the main deflection values are within the drawable range, and a step 108 shown in FIG. 9 decides whether or not the sub field exposure has ended in the case shown in FIG. 10 (c) through (h). The same exposure operation is continued until the exposure of one sub field ends. After the exposure of one sub field ends, a step 109 shown in FIG. 9 decides whether or not the exposure has ended for all of the data of one cell.

If the exposure is not ended for all sub fields of one cell, the operation is again started from the step 101 shown in FIG. 9 to read the next pattern data (main deflection data), and operations similar to those described above are repeated.

If $Y_{IOUT}<$(maximum value of the drawable range)−1 mm in the step 107 shown in FIG. 9, the main deflection values $D_{3i}$ and $D_{3j}$ shown in FIG. 10 (i) and (j) are outside the drawable range. In this case, the stage 35 is moving away and a main deflection overflow is detected in a step 110 shown in FIG. 9, and the operation ends by an error end in a step 111 shown in FIG. 9.

This embodiment separates the error component into the stage difference values which are independent on the rotation of the substrate 36 relative to the stage 35, and the main deflection values which are dependent on the rotation of the substrate 36 relative to the stage 35. In other words, the stage difference values are subjected to the stage correcting operation so that the stage difference values match the axis of the stage coordinate system. On the other hand, the main deflection values are subjected to the cell correcting operation so that the rotation of the substrate 36 is corrected. Therefore, it is possible to carry out an optimum control of the electron beam deflection with a high accuracy.

Accordingly, this embodiment is not only applicable to a glass plate which is used as the substrate 36 for making reticles and masks, but is also particularly applicable to a wafer which is used as the substrate 36 for aligning patterns to an underlying layer.

The formulas (1) and (2) used in the stage correcting operation and the formulas (3) and (4) used in the cell correcting operation in this embodiment are similar to each other. For this reason, the circuit shown in FIG. 8 can be used for both the state correcting operation circuit 25 and the cell correcting operation circuit 26 by simply setting different correction coefficients. As a result, it is possible to minimize the number of kinds of printed circuits to be mounted in the electron beam exposure apparatus.

Figure 11:
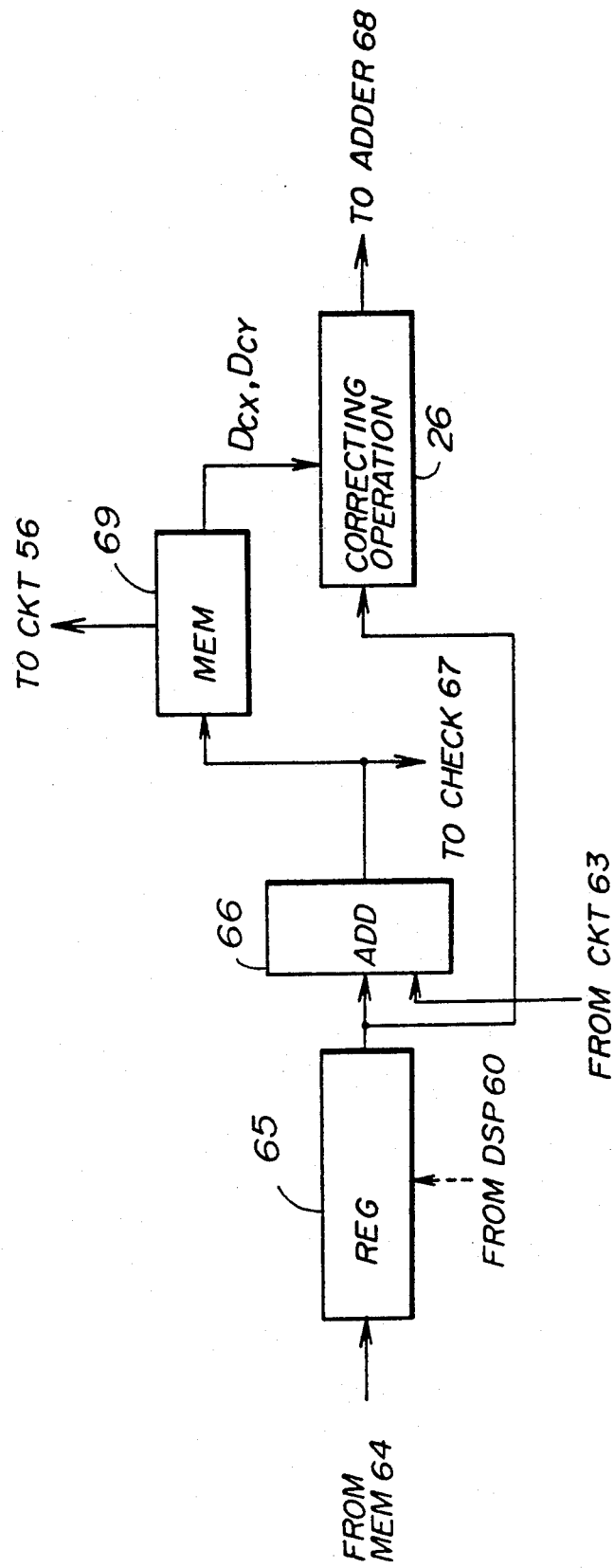
FIG. 11 is a system block diagram showing an essential part of a second embodiment of the charged particle beam exposure apparatus according to the present invention.

Next, a description will be given of a second embodiment of the charged particle beam exposure apparatus according to the present invention. FIG. 11 shows an essential part of this embodiment. In FIG. 11, those parts which are the same as those corresponding parts in FIG. 6 are designated by the same reference numerals, and a description thereof will be omitted. In this embodiment, the cell correcting operation circuit 26 receives the deflection data $D_2$ from the main deflection position register 65 and distortion correction coefficients $D_{CX}$ and $D_{CY}$ which are read out from the correction memory 69.

In this embodiment, the stage correcting operation circuit 25 and the cell correcting operation circuit 26 respectively carry out correcting operations different from those of the first embodiment. In other words, this embodiment is characterized in that the distortion correction coefficients $D_{CX}$ and $D_{CY}$ which are read out from the correction memory 69 using the main deflection position as the address are employed as a means of correcting the high-order main deflector deflection error which cannot be corrected in the first embodiment.

That is, the stage correcting operation circuit 25 carries out the correcting operation with respect to the inputs $X_{SIN}$ and $Y_{SIN}$ based on the following formulas (7) and (8).

$$X_{SOUT}=(1+G_{SX})X_{SIN}+R_{SX}Y_{SIN} \qquad (7)$$

$$Y_{SOUT} = (1 + G_{SY})Y_{SIN} + R_{SY}X_{SIN} \quad (8)$$

On the other hand, the cell correcting operation circuit 26 carries out the correcting operation with respect to the inputs $X_{CIN}$ and $Y_{CIN}$ based on the following formulas (9) and (10).

$$X_{COUT} = (1 + G_{CX})X_{CIN} + R_{CX}Y_{CIN} + H_{CX}X_{CIN}Y_{CIN} + O_{CX} + D_{CX} \quad (9)$$

$$Y_{COUT} = (1 + G_{CY})Y_{CIN} + R_{CY}X_{CIN} + H_{CY}X_{CIN}Y_{CIN} + O_{CY} + D_{CY} \quad (10)$$

In the formulas (7) through (10), the same designations are used as in the formulas (1) through (4).

When obtaining the distortion correction coefficients $D_{CX}$ and $D_{CY}$, the stage 35 is moved to the four corners of the main deflector deflecting range, and each correction coefficient is obtained so that the deflection error becomes zero at the four corners. Thereafter, the trapezoidal correction coefficients $H_{CX}$ and $H_{CY}$ are respectively set to zero, and the error value at each deflecting position is obtained while moving at equal distances within the deflecting range. The error values obtained by this procedure are stored in the correction memory 69 as the distortion correction coefficients $D_{CX}$ and $D_{CY}$.

In this embodiment, the formulas (7) and (8) which are used for the stage correcting operation are simple and have a smaller number of multiplications compared to the formulas (1) and (2) which are used in the first embodiment. For this reason, the circuit construction can be simplified in the second embodiment. In addition, in the case of the pipeline processing, the operation result can be obtained at a high speed because of the reduced number of multiplications.

The present invention is applied to the electron beam exposure processing in the embodiments described above. However, the present invention is not limited to the electron beam exposure and is of course applicable to any charged particle beam exposures other than the electron beam exposure.

Further, the present invention is not limited to these embodiments, but various variations and modifications may be made without departing from the scope of the present invention.

What is claimed is:

1. A charged particle beam exposure method for drawing a pattern on a substrate which is carried on a continuously moving stage by deflecting a charged particle beam by a deflector means depending on the pattern which is to be drawn, said charged particle beam exposure method comprising the steps of:

(a) moving the stage in a direction parallel to an axis of a coordinate system of the substrate;
   (b) generating a first deflection data $D_1$ in a coordinate system of the stage by obtaining a position coordinate of a reference position of a pattern region which includes the pattern which is to be drawn relative to a target position of the stage, and for obtaining a second deflection data $D_2$ in the coordinate system of the substrate describing a position coordinate of the pattern which is to be drawn from the reference position of the pattern region to which the pattern belongs;
   (c) carrying out with respect to the first deflection data $D_1$ a first correcting operation which includes correction of a pattern distortion inherent to a charged particle beam exposure apparatus, and for carrying out the first correcting operation and a second correcting operation with respect to the second deflection data $D_2$ after making a coordinate conversion to the coordinate system of the stage, said second correcting operation correcting a rotation error component relative to the stage caused by the movement of the substrate;
   (d) obtaining a third deflection data $D_3'$ which describes a position coordinate of the pattern which is to be drawn from the present position of the stage by adding a corrected first deflection data $D_1'$ and a corrected second deflection data $D_2'$ which are obtained in said step (c); and
   (e) controlling the deflector means based on the third deflection data $D_3'$.

2. The charged particle beam exposure method as claimed in claim 1, wherein said step (c) carries out the first correcting operation with respect to the first deflection data $D_1 = (X_{SIN}, Y_{SIN})$ to obtain the corrected first deflection data $D_1' = (X_{SOUT}, Y_{SOUT})$ based on the following formulas, where $G_{SX}$ and $G_{SY}$ denote gain correction coefficients, $R_{SX}$ and $R_{SY}$ denote rotation correction coefficients, $H_{SX}$ and $H_{SY}$ denote trapezoidal correction coefficients, $O_{SX}$ and $O_{SY}$ denote offset correction coefficients, and subscripts X and Y of each correction coefficient respectively indicate X and Y directions in the X-Y coordinate system of the stage, $$X_{SOUT} = (1 + G_{SX})X_{SIN} + R_{SX}Y_{SIN} + H_{SX}X_{SIN}Y_{SIN} + O_{SX}$$

$$Y_{SOUT} = (1 + G_{SY})Y_{SIN} + R_{SY}X_{SIN} + H_{SY}Y_{SIN}X_{SIN} + O_{SY}$$

and said step (c) carries out the second correcting operation with respect to the second deflection data $D_2 = (X_{CIN}, Y_{CIN})$ to obtain the corrected second deflection data $D_2' = (X_{COUT}, Y_{COUT})$ based on the following formulas, where $G_{CX}$ and $G_{CY}$ denote gain correction coefficients, $R_{CX}$ and $R_{CY}$ denote rotation correction coefficients, $H_{CX}$ and $H_{CY}$ denote trapezoidal correction coefficients, $O_{CX}$ and $O_{CY}$ denote offset correction coefficients, and subscripts X and Y of each correction coefficient respectively indicate the X and Y directions in the X-Y coordinate system of the stage, $$X_{COUT} = (1 + G_{CX})X_{CIN} + R_{CX}Y_{CIN} + H_{CX}X_{CIN}Y_{CIN} + O_{CX}$$

$$Y_{COUT} = (1 + G_{CY})X_{CIN} + R_{CY}X_{CIN} + H_{CY}Y_{CIN}X_{CIN} + O_{CY}.$$

3. The charged particle beam exposure method as claimed in claim 1, wherein said step (c) carries out the first correcting operation with respect to the first deflection data $D_1 = (X_{SIN}, Y_{SIN})$ to obtain the corrected first deflection data $D_1' = (X_{SOUT}, Y_{SOUT})$ based on the following formulas, where $G_{SX}$ and $G_{SY}$ denote gain correction coefficients, $R_{SX}$ and $R_{SY}$ denote rotation correction coefficients, and subscripts X and Y of each correction coefficient respectively indicate X and Y directions in the X-Y coordinate system of the stage, $$X_{SOUT} = (1 + G_{SX})X_{SIN} + R_{SX}Y_{SIN}$$

$$Y_{SOUT} = (1 + G_{SY})Y_{SIN} + R_{SY}X_{SIN}$$

and said step (c) carries out the second correcting operation with respect to the second deflection data $D_2 = (X_{CIN}, Y_{CIN})$ to obtain the corrected second deflection data $D_2' = (X_{COUT}, Y_{COUT})$ based on the following formulas, where $G_{CX}$ and $G_{CY}$ denote gain correction coefficients, $R_{CX}$ and $R_{CY}$ denote rotation correction coefficients, $H_{CX}$ and $H_{CY}$ denote trapezoidal correction coefficients, $O_{CX}$ and $O_{CY}$ denote offset correction coefficients, $D_{CX}$ and $D_{CY}$ denote distortion correction coefficients, and subscripts X and Y of each correction coefficient respectively indicate the X and Y directions in the X-Y coordinate system of the stage, $$X_{COUT} = (1 + G_{CX})X_{CIN} + R_{CX}Y_{CIN} + H_{CX}X_{CIN}Y_{CIN} + O_{CX} + D_{CX}$$

$$Y_{COUT} = (1 + G_{CY})Y_{CIN} + R_{CY}X_{CIN} + H_{CY}Y_{CIN}X_{CIN} + O_{CY} + D_{CY}.$$

4. The charged particle beam exposure method as claimed in claim 1, wherein said step (e) controls the deflector means so that the charged particle beam is deflected in a direction perpendicular to the moving direction of the stage.

5. The charged particle beam exposure method as claimed in claim 1, wherein said step (c) carries out the first correcting operation which includes correction of a rotation error peculiar to a charged particle beam exposure apparatus used, and carries out the second correcting operation which includes correction of a rotation error caused by a difference between the coordinate system of the stage and the coordinate system of the substrate and correction of a rotation error caused by the moving stage.

6. The charged particle beam exposure method as claimed in claim 1, wherein the first deflection data $D_1$ describes a vector from a center position of a drawable range in which the charged particle beam can be deflected by the deflector means to a center position of a cell of the substrate, the second deflection data $D_2$ describes a vector from the center position of the cell of the substrate to a position of the pattern which is to be drawn within the cell which forms the pattern region, the third deflection data $D_3'$ describes a vector from the center position of the drawable range to the position of the pattern which is to be drawn within the cell, the first and third deflection data $D_1$ and $D_3$ are described in the coordinate system of the stage, and the second deflection data $D_2$ is described in the coordinate system of the substrate.

7. A charged particle beam exposure apparatus comprising:
a movable stage which carries a substrate;
stage moving means for continuously moving said stage in a direction parallel to an axis of a coordinate system of the substrate;
a charged particle beam generating source for generating a charged particle beam;
deflector means for deflecting the charged particle beam depending on a pattern which is to be drawn and for drawing the pattern on the substrate by the deflected charged particle beam;
generating means for generating a first deflection data $D_1$ in a coordinate system of the stage by obtaining a position coordinate of a reference position of a pattern region which includes the pattern which is to be drawn relative to a target position of the stage;
obtaining means for obtaining a second deflection data $D_2$ in a coordinate system of the substrate describing a position coordinate of the pattern which is to be drawn from the reference position of the pattern region to which the pattern belongs;
first correcting operation means for carrying out with respect to the first deflection data $D_1$ a first correcting operation which includes correction of a pattern distortion inherent to the charged particle beam exposure apparatus;
second correcting operation means for carrying out the first correcting operation and a second correcting operation with respect to the second deflection data $D_2$ after making a coordinate conversion to the coordinate system of the stage, said second correcting operation correcting a rotation error component relative to the stage caused by the movement of the substrate; and
adding means for obtaining a third deflection data $D_3'$ which describes a position coordinate of the pattern which is to be drawn from the present position of said stage by adding a corrected first deflection data $D_1'$ which is obtained from said first correcting operation means and a corrected second deflection data $D_2'$ which is obtained from said second correcting operation means,
said deflector means being controlled based on the third deflection data $D_3'$.

8. The charged particle beam exposure apparatus as claimed in claim 7, wherein said first correcting operation means carries out the first correcting operation with respect to the first deflection data $D_1 = (X_{SIN}, Y_{SIN})$ to obtain the corrected first deflection data $D_1' = (X_{SOUT}, Y_{SOUT})$ based on the following formulas, where $G_{SX}$ and $G_{SY}$ denote gain correction coefficients, $R_{SX}$ and $R_{SY}$ denote rotation correction coefficients, $H_{SX}$ and $H_{SY}$ denote trapezoidal correction coefficients, $O_{SX}$ and $O_{SY}$ denote offset correction coefficients, and subscripts X and Y of each correction coefficient respectively indicate X and Y directions in the X-Y coordinate system of the stage, $$X_{SOUT} = (1 + G_{SX})X_{SIN} + R_{SX}Y_{SIN} + H_{SX}X_{SIN}Y_{SIN} + O_{SX}$$

$$Y_{SOUT} = (1 + G_{SY})Y_{SIN} + R_{SY}X_{SIN} + H_{SY}Y_{SIN}X_{SIN} + O_{SY}$$

and said second correcting operation means carries out the second correcting operation with respect to the second deflection data $D_2 = (X_{CIN}, Y_{CIN})$ to obtain the corrected second deflection data $D_2' = (X_{COUT}, Y_{COUT})$ based on the following formulas, where $G_{CX}$ and $G_{CY}$ denote gain correction coefficients, $R_{CX}$ and $R_{CY}$ denote rotation correction coefficients, $H_{CX}$ and $H_{CY}$ denote trapezoidal correction coefficients, $O_{CX}$ and $O_{CY}$ denote offset correction coefficients, and subscripts X and Y of each correction coefficient respectively indicate the X and Y directions in the X-Y coordinate system of the stage, $$X_{COUT} = (1 + G_{CX})X_{CIN} + R_{CX}Y_{CIN} + H_{CX}X_{CIN}Y_{CIN} + O_{CX}$$

$$Y_{COUT} = (1 + G_{CY})X_{CIN} + R_{CY}X_{CIN} + H_{CY}Y_{CIN}X_{CIN} + O_{CY}.$$

9. The charged particle beam exposure apparatus as claimed in claim 7, wherein said first correcting operation means carries out the first correcting operation with respect to the first deflection data $D_1 = (X_{SIN}, Y_{SIN})$ to obtain the corrected first deflection data $D_1' = (X_{SOUT}, Y_{SOUT})$ based on the following formulas, where $G_{SX}$ and $G_{SY}$ denote gain correction coefficients, $R_{SX}$ and $R_{SY}$ denote rotation correction coefficients, and subscripts X and Y of each correction coefficient respectively indicate X and Y directions in the X-Y coordinate system of the stage, $$X_{SOUT} = (1+G_{SX})X_{SIN} + R_{SX}Y_{SIN}$$

$$Y_{SOUT} = (1+G_{SY})Y_{SIN} + R_{SY}X_{SIN}$$

and said second correcting operation means carries out the second correcting operation with respect to the second deflection data $D_2 = (X_{CIN}, Y_{CIN})$ to obtain the corrected second deflection data $D_2' = (X_{COUT}, Y_{COUT})$ based on the following formulas, where $G_{CX}$ and $G_{CY}$ denote gain correction coefficients, $R_{CX}$ and $R_{CY}$ denote rotation correction coefficients, $H_{CX}$ and $H_{CY}$ denote trapezoidal correction coefficients, $O_{CX}$ and $O_{CY}$ denote offset correction coefficients, $D_{CX}$ and $D_{CY}$ denote distortion correction coefficients, and subscripts X and Y of each correction coefficient respectively indicate the X and Y directions in the X-Y coordinate system of the stage, $$X_{COUT} = (1 + G_{CX})X_{CIN} + R_{CX}Y_{CIN} + H_{CX}X_{CIN}Y_{CIN} + O_{CX} + D_{CX}$$

$$Y_{COUT} = (1 + G_{CY})Y_{CIN} + R_{CY}X_{CIN} + H_{CY}Y_{CIN}X_{CIN} + O_{CY} + D_{CY}.$$

10. The charged particle beam exposure apparatus as claimed in claim 7, wherein said deflector means is controlled based on the third deflection data $D_3'$ so that the charged particle beam is deflected in a direction perpendicular to the moving direction of the stage.

11. The charged particle beam exposure apparatus as claimed in claim 7, wherein said first correcting operation means carries out the first correcting operation which includes correction of a rotation error peculiar to a charged particle beam exposure apparatus used, and said second correcting operation means carries out the second correcting operation which includes correction of a rotation error caused by a difference between the coordinate system of the stage and the coordinate system of the substrate and correction of a rotation error caused by the moving stage.

12. The charged particle beam exposure apparatus as claimed in claim 7, wherein the first deflection data $D_1$ describes a vector from a center position of a drawable range in which the charged particle beam can be deflected by the deflector means to a center position of a cell of the substrate, the second deflection data $D_2$ describes a vector from the center position of the cell of the substrate to a position of the pattern which is to be drawn within the cell which forms the pattern region, the third deflection data $D_3'$ describes a vector from the center position of the drawable range to the position of the pattern which is to be drawn within the cell, the first and third deflection data $D_1$ and $D_3$ are described in the coordinate system of the stage, and the second deflection data $D_2$ is described in the coordinate system of the substrate.

* * * * *

UNITED STATES PATENT AND TRADEMARK OFFICE
CERTIFICATE OF CORRECTION

PATENT NO. : 5,329,130
DATED : July 12, 1994
INVENTOR(S) : Junichi KAI et al.

It is certified that error appears in the above-indentified patent and that said Letters Patent is hereby corrected as shown below:

Column 1, Line 26, delete "the".

Column 12, Line 21, change "$D_2$from" to --$D_2$ from--.

Column 16, Line 48, Claim 2, change
"$Y_{COUT} = (1 + G_{CY})X_{CIN} + R_{CY}X_{CIN} + H_{CY}Y_{CIN}X_{CIN} + O_{CY}.$" to
--$Y_{COUT} = (1 + G_{CY})Y_{CIN} + R_{CY}X_{CIN} + H_{CY}Y_{CIN}X_{CIN} + O_{CY}.$--

Signed and Sealed this

Eighteenth Day of October, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,329,130
DATED : July 12, 1994
INVENTOR(S) : Junichi KAI et al.

It is certified that error appears in the above-indentified patent and that said Letters Patent is hereby corrected as shown below:

On the Cover Page, under [73] Assignee, please change the Assignee to read

--FUJITSU LIMITED, Kawasaki, Japan; and
FUJITSU VSLI LIMITED, Kasugai, Japan--.

Signed and Sealed this

Twenty-ninth Day of August, 1995

Attest:

BRUCE LEHMAN

Attesting Officer     Commissioner of Patents and Trademarks